United States Patent
Coffy et al.

(10) Patent No.: US 11,740,416 B2
(45) Date of Patent: Aug. 29, 2023

(54) OPTOELECTRONIC DEVICE

(71) Applicant: STMicroelectronics (Grenoble 2) SAS, Grenoble (FR)

(72) Inventors: Romain Coffy, Voiron (FR); Jean-Michel Riviere, Froges (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 17/546,314

(22) Filed: Dec. 9, 2021

(65) Prior Publication Data

US 2022/0196938 A1    Jun. 23, 2022

(30) Foreign Application Priority Data

Dec. 18, 2020 (FR) ...................................... 2013740

(51) Int. Cl.
G02B 6/42    (2006.01)

(52) U.S. Cl.
CPC ......... *G02B 6/4239* (2013.01); *G02B 6/4213* (2013.01); *G02B 6/4274* (2013.01)

(58) Field of Classification Search
CPC ... G02B 6/4239; G02B 6/4213; G02B 6/4274
See application file for complete search history.

(56) References Cited

U.S. PATENT DOCUMENTS

| | | |
|---|---|---|
| 2004/0061799 A1 | 4/2004 | Atarashi et al. |
| 2006/0006486 A1 | 1/2006 | Seo et al. |
| 2009/0266988 A1 | 10/2009 | Honda et al. |
| 2015/0124195 A1* | 5/2015 | Chen ................. G02F 1/133512 362/97.4 |
| 2016/0306265 A1 | 10/2016 | Riel et al. |
| 2021/0202811 A1* | 7/2021 | Zimmerman ......... H01L 33/644 |

FOREIGN PATENT DOCUMENTS

WO    2008093463 A1    8/2008

OTHER PUBLICATIONS

INPI Search Report and Written Opinion for priority application, FR 2013740, report dated Aug. 19, 2021, 10 pages.

* cited by examiner

*Primary Examiner* — Sung H Pak
*Assistant Examiner* — Hoang Q Tran
(74) *Attorney, Agent, or Firm* — CROWE & DUNLEVY

(57) ABSTRACT

An optoelectronic element is located in a package. The package includes a first optical block and a second optical block that are attached to each other by a bonding layer. One of the first and second optical blocks is attached to lateral walls of the package by glue. The material of the bonding layer is configured to induce less stress to the first and second optical blocks than the glue.

22 Claims, 4 Drawing Sheets

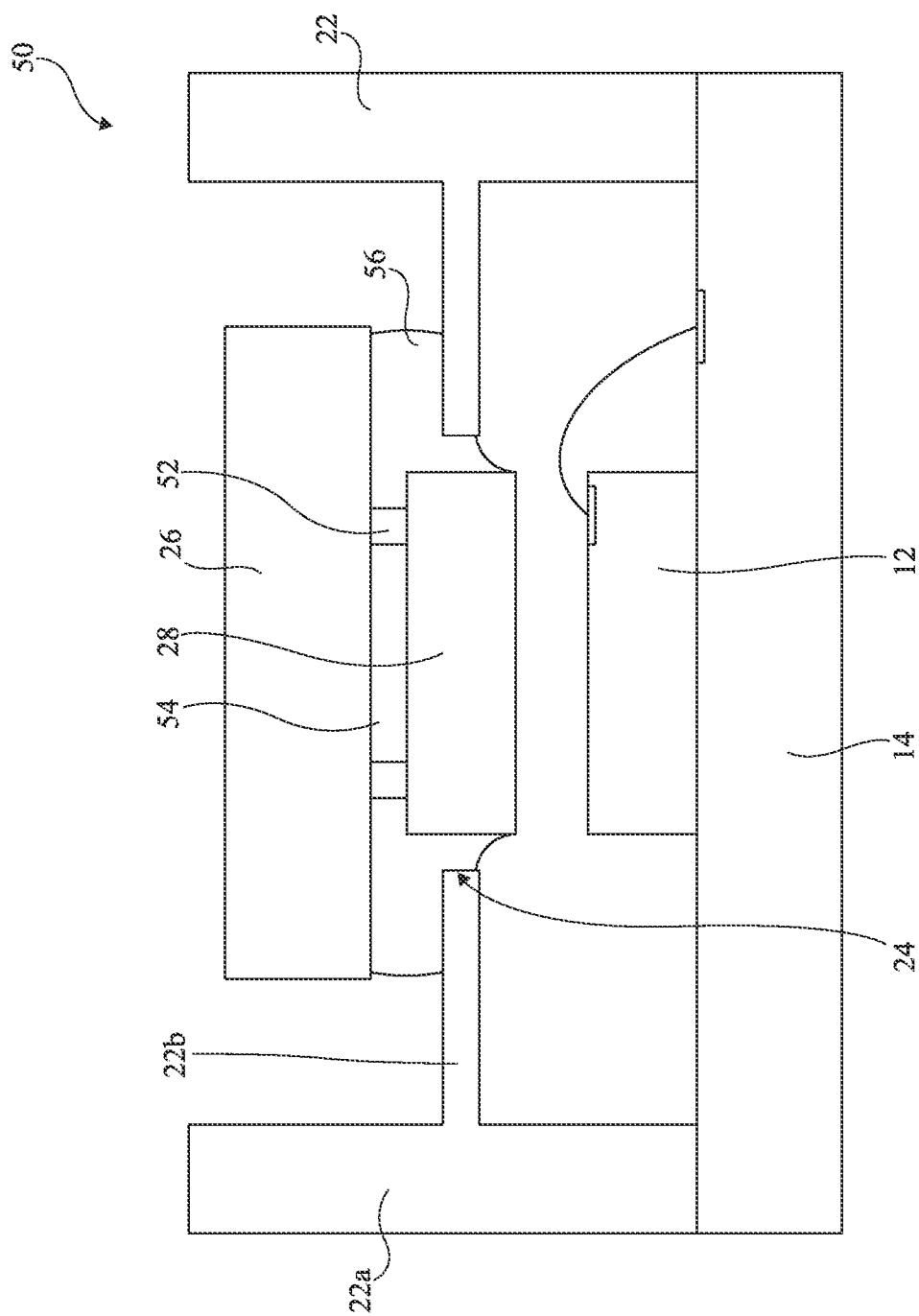

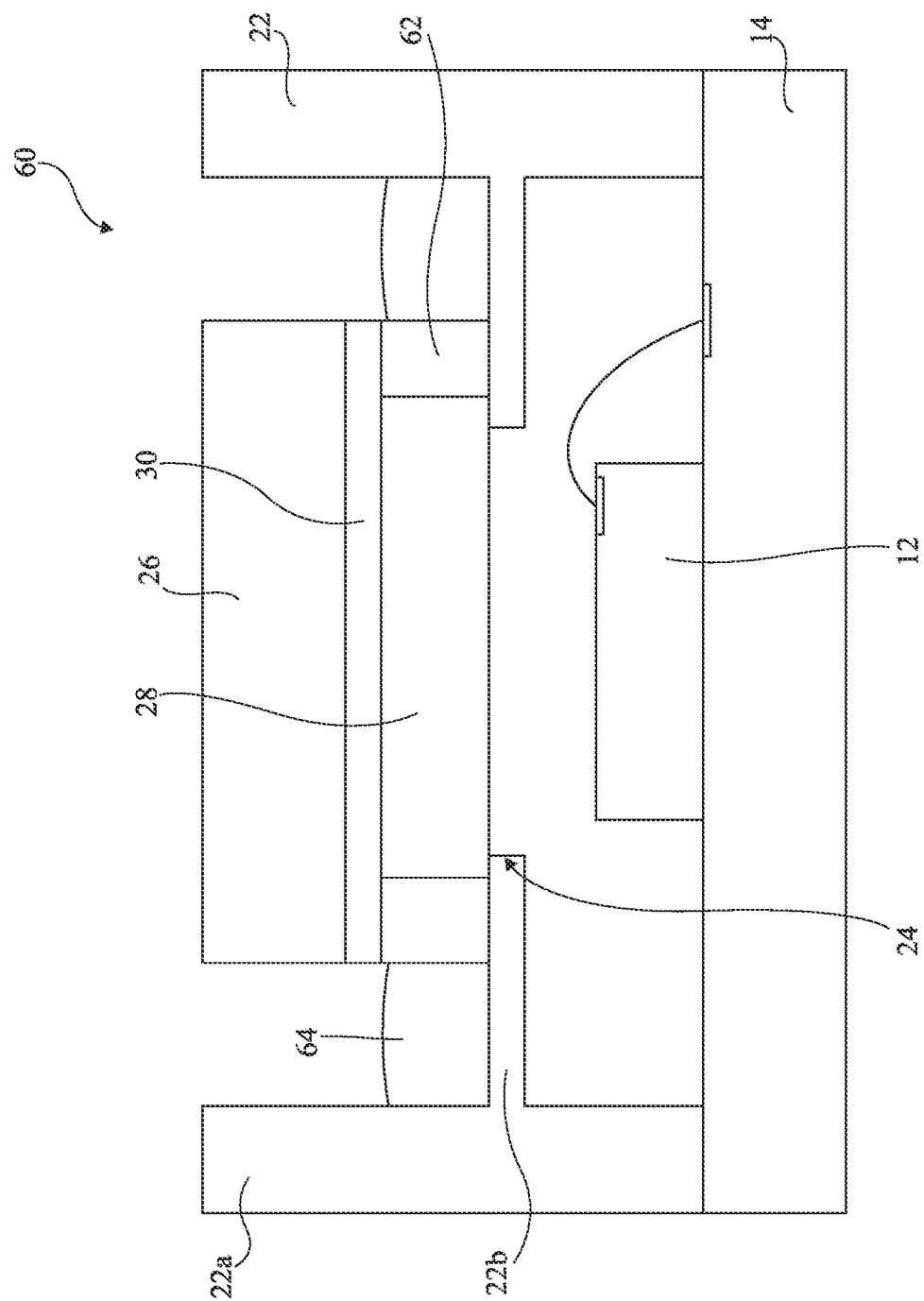

OPTOELECTRONIC DEVICE

PRIORITY CLAIM

This application claims the priority benefit of French Application for Patent No. 2013740, filed on Dec. 18, 2020, the content of which is hereby incorporated by reference in its entirety to the maximum extent allowable by law.

TECHNICAL FIELD

The present disclosure generally concerns optoelectronic devices and, more particularly, devices comprising an optical diffuser and a filter.

BACKGROUND

Optoelectronic devices comprising an assembly of an optical diffuser and a filter, the assembly being located opposite an emitter or a detector of light rays, are known. The optical diffuser is an optical block configured to modify light rays, for example by diffusing them or by polarizing them. The filter is an optical block which gives way to part of the light ray, without otherwise affecting its travel.

There is a need in the art to overcome all or part of the disadvantages of known devices comprising an optical diffuser and a filter

SUMMARY

An embodiment provides a device comprising an optoelectronic element located in a package, the package comprising a first optical block and a second optical block attached to each other by a bonding element, one of the first and second optical blocks being attached to lateral walls of the package by glue, the material of the bonding element being such that the bonding element induces less stress during its passage to the solid state than the glue.

Another embodiment provides a method of manufacturing a device comprising an optoelectronic element located in a package, the method comprising the attaching of a first optical block of the package and of a second optical block of the package to each other by a bonding element, one of the first and second optical blocks being attached to a lateral wall of the package by glue, the material of the bonding element being such that the bonding element induces less stress at its passage to the solid state than the glue.

According to an embodiment, the first optical block is an optical diffuser.

According to an embodiment, the first optical block is a planar chip configured to carry out optical functions such as the diffusion, the polarization, or the focusing of the light rays crossing it.

According to an embodiment, the second optical block comprises at least one filter.

According to an embodiment, the bonding element is made of resin.

According to an embodiment, the bonding element is made of a material having a linear expansion coefficient in the range from 150 ppm/K to 200 ppm/K.

According to an embodiment, the lateral walls comprise a vertical portion and a horizontal portion extending from the vertical portion, said one of the first and second optical blocks resting on the lateral walls resting on the horizontal portion, the horizontal portion surrounding an opening located opposite at least a portion of the optoelectronic element.

According to an embodiment, the first optical block rests on the horizontal portion and the second optical block is located on the opening.

According to an embodiment, the bonding element entirely covers a surface of the first optical block.

According to an embodiment, the bonding element entirely covers a surface of the second optical block.

According to an embodiment, the first optical block is separated from the glue by the bonding element.

According to an embodiment, the bonding element partially covers a surface of the second optical block.

According to an embodiment, the horizontal dimensions of the first optical block are greater than the horizontal dimensions of the second optical block, the second optical block being surrounded with an element resting on the horizontal portion of the lateral walls.

According to an embodiment, the horizontal dimensions of the first optical block are substantially equal to the horizontal dimensions of the second optical block, the second optical block resting on the horizontal portion of the lateral walls.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 3 shows another embodiment of an optoelectronic device; and

FIG. 4 shows another embodiment of an optoelectronic device.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
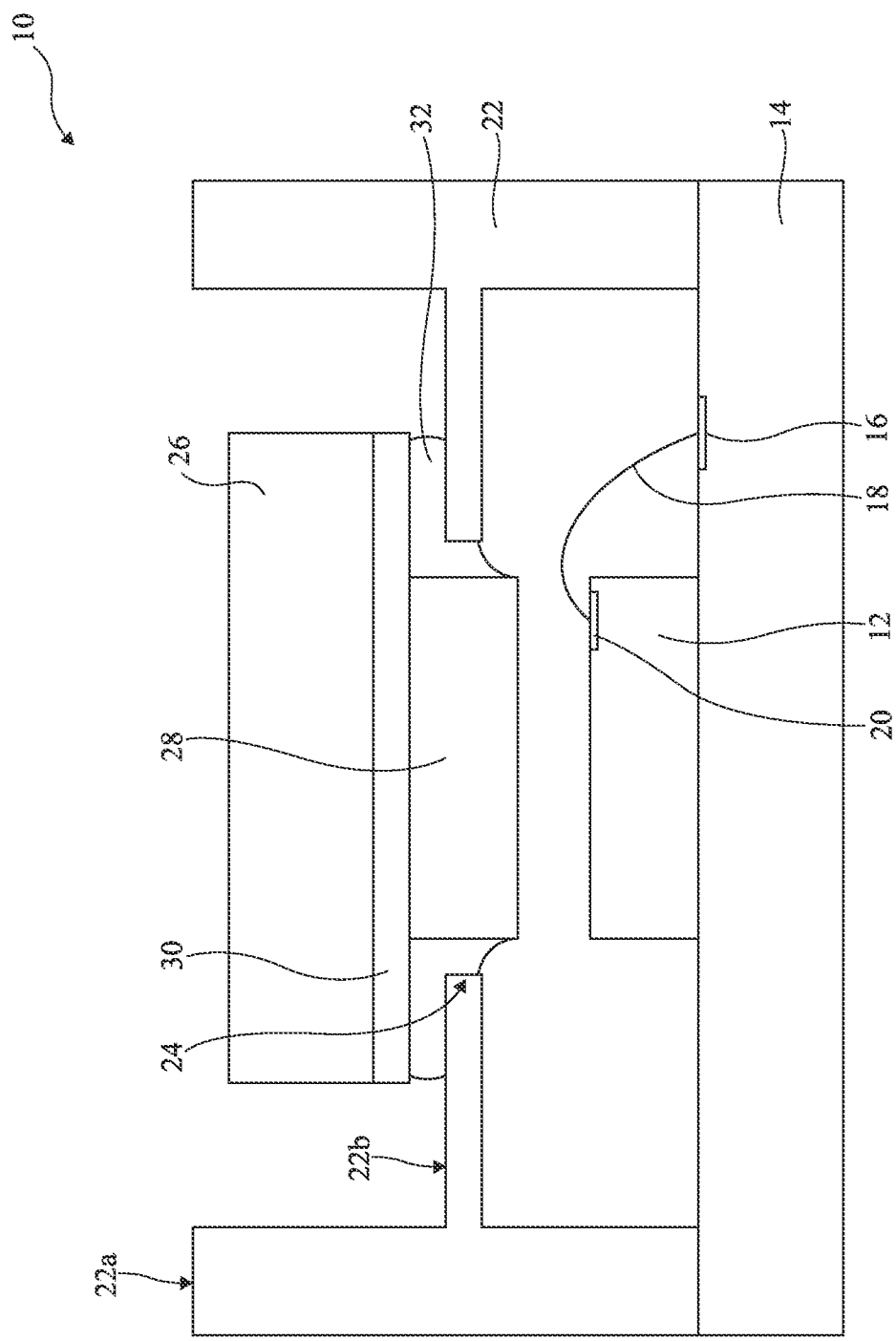
FIG. 1 shows an embodiment of an optoelectronic device.

FIG. 1 shows an embodiment of an optoelectronic device 10.

Device 10 comprises an integrated circuit chip 12. Chip 12 is an optoelectronic device, that is, an electronic element emitting light or interacting with light. Chip 12, for example, comprises a light ray emitter and/or a photodetector.

Chip 12 is located in a package. The package comprises a support 14. Chip 12 is located on support 14. The chip is attached to an upper surface of support 14 using, for example, a bonding layer (such as, for example, a glue layer or a metal solder layer).

Support 14, for example, comprises one or a plurality of insulating layers. Support 14, for example, comprises conductive tracks and conductive vias. In particular, support 14 may comprise conductive tracks 16 coupled, for example by electric cables 18, to conductive pads 20 of the chip. Thus, chip 12 may be electrically coupled to support via pads 20, cables 18, and tracks 16.

The package of device 10 further comprises lateral walls 22. Walls 22 preferably rest on support 14. Lateral walls 22 extend, preferably continuously, around chip 12 and, preferably, around pads 16. Walls 22 comprise a vertical portion 22a and a horizontal portion 22b.

Portion 22a extends from support 14. Portion 22a preferably extends in a direction orthogonal to the upper surface of support 14.

Portion 22b extends from portion 22a. Portion 22b extends towards chip 12, that is, towards the center of a ring formed by portions 22a. Portion 22b thus extends from the surface of the portions 22b closest to chip 12. Preferably, portion 22a extends above and under portion 22b. In other words, portion 22a preferably extends from portion 22b in two directions. Portion 22b is located at a height greater than the chip height. In other words, the distance between a lower surface of portion 22b, that is, the surface closest to the support, and the upper surface of support 14 is greater than the chip height (i.e., thickness), more precisely greater than the distance between the upper surface of chip 12 and the upper surface of support 14.

Portion 22b preferably forms a ring extending inside of the ring formed by portions 22a. Portion 22b thus forms an opening 24 at the center of the ring formed by portion 22b. As a variant, portion 22b extends on two surfaces of portions 22a, preferably opposite surfaces.

The material of walls 22 is at least partially opaque, preferably at least partially opaque to the wavelengths emitted by chip 12 or to the wavelengths received by chip 12. Preferably, the material of walls 22 is completely opaque.

Opening 24 is located opposite a portion of chip 12. More precisely, opening 24 is located opposite a portion of the chip configured to emit or receive light rays.

Device 10 further comprises a first optical block 26 and a second optical block 28.

Optical block 26 comprises an optical diffuser. Optical block 26 is a planar chip which carries out optical functions such as the diffusion, the polarization, or the focusing of the light rays crossing it. For example, optical block 26 comprises a body, preferably planar, on which the growth of different layers of materials such as anti-reflectors, and possibly of other diffusion layers, has been carried out. For example, optical block 26 is formed by a body, preferably planar, on which the growth of different layers of materials such as anti-reflectors, and possibly other diffusion layers, has been performed. The body is preferably made of glass. Preferably, the layers of anti-reflector material are formed of a plurality of thin layers deposited on both sides of the glass body. For example, at least one of the layers is a lens. For example, at least one of the layers is a diffusion layer. For example, at least one of the layers is a polarization layer.

For example, optical block 28 comprises, preferably is formed by, one or a plurality of filters, that is, one or a plurality of layers made of materials allowing the passage of certain wavelengths and blocking the passage of other wavelengths.

Optical blocks 26 and 28 are attached to each other by a bonding layer 30 to form an optical assembly. Bonding layer 30 is thus in contact with the lower surface of optical block 26 and the upper surface of optical block 28. More precisely, a lower surface of optical block 26 is attached to an upper surface of optical block 28 by bonding layer 30. Bonding layer 30 is thus in contact with the lower surface of optical block 26 and the upper surface of optical block 28. Optical blocks 26 and 28 are thus totally separated from each other by layer 30. Layer 30 is made of an at least partially transparent material, in particular at least partially transparent to the wavelengths emitted by chip 12 after the rays have crossed filter 28 or to the wavelengths received by chip 12 before their passage through filter 28.

Layer 30 is preferably made of a single material. The material of layer 30 is preferably homogeneous. The material of layer 30 is a low-deformation material. In other words, the material of layer 30 is a material deforming little during its passage to the solid state. The material of layer 30, for example, has a viscosity in the range from 400 mPa·S to 500 mPa·S, for example substantially equal to 450 mPa·S. The material of layer 30, for example, has a Young's modulus in the range from 2,800 MPa to 3,200 MPa, for example substantially equal to 3,000 MPa. The material of layer 30, for example, has a linear expansion coefficient in the range from 150 ppm/K to 200 ppm/K, for example substantially equal to 173 ppm/K. The material of layer 30 is a resin, for example the resin known under trade name "DELO KATIOBOND VE 128725", or a resin having similar properties.

It could have been chosen to attach optical blocks 26 and 28 to each other in forming the optical assembly with a glue layer. However, glues are generally materials inducing a significant stress, in particular during the drying. Such a stress, when the glue is in contact with optical block 26, deforms the layers of optical block 26 and modifies the characteristics of optical block 26 in an unforeseeable manner. The material of layer 30 is thus selected to be such that it induces a less significant stress during its passage to the solid state than glue.

The horizontal dimensions, that is, in a plane substantially parallel to the upper surface of support 14, of layer 30 are preferably substantially equal to the horizontal dimensions of optical block 26. Thus, the lower surface of optical block 26 is preferably entirely covered with layer 30.

At least one horizontal dimension, preferably all the horizontal dimensions, of optical block 28 are smaller than the dimensions of optical block 26. Thus, optical block 28 is located opposite a portion, preferably a central, or inner, portion of optical block 26. A peripheral portion of optical block 26 is thus not located opposite optical block 28.

The assembly comprising optical blocks 26 and 28 and layer 30 is attached to lateral walls 22 in order to close opening 24. Optical block 28 is located in opening 24. Preferably, optical block 28 is not in contact with chip 12. Optical block 26 and layer 30 rest on the portion 22b of lateral walls 22. The dimensions of optical block 28 are thus selected to enable optical block 28 to be located within opening 24. The horizontal dimensions of optical block 28 are thus smaller than the dimensions of opening 24. The horizontal dimensions of optical block 26 are greater than those of opening 24. Preferably, portions 22a extend around optical block 26. Thus, the distance between the upper surface of portions 22a and the upper surface of support 14 is greater than the distance between the upper surface of optical block 26 and the upper surface of support 14.

The portions of layer 30 which are not covered with optical block 28 are separated from portion 22b by a glue layer 32. Further, the lateral walls of optical block 28 are preferably separated from portions 22b by glue layer 32. Preferably, glue layer 32 does not extend over the lateral walls of optical block 26. Optical block 26 is thus not in contact with glue layer 32.

Opening 24 is thus closed by optical block 28 and glue 32. Glue 32 is an at least partially opaque glue, preferably at least partially opaque to the wavelengths emitted by chip 12 or to the wavelengths received by chip 12 before they cross through optical block 28. Preferably, glue 32 is completely opaque. Thus, light rays can only enter or come out of the package via optical block 28.

The package surrounding chip 12 thus comprises support 14, walls 22, the assembly comprising optical blocks 26 and 28, layer 30, and glue layer 32.

As a variant, the horizontal dimensions of layer 30 may be substantially equal to the horizontal dimensions of optical block 28. Thus, layer 30 totally covers the upper surface of optical block 28 and partially covers the lower surface of optical block 26. The peripheral portion of the lower surface of optical block 26, rests on portions 22b. Said peripheral portion is then directly attached to portions 22b by glue 32. The contact between optical block 26 and the glue may cause stress on optical block 26 in the peripheral portions and thus a deformation of optical block 26. This deformation however does not significantly extend to the center of optical block 26, that is, to the portion of optical block 26 located opposite chip 12, that is, the portion crossed by the most part of the light rays.

Figure 2:
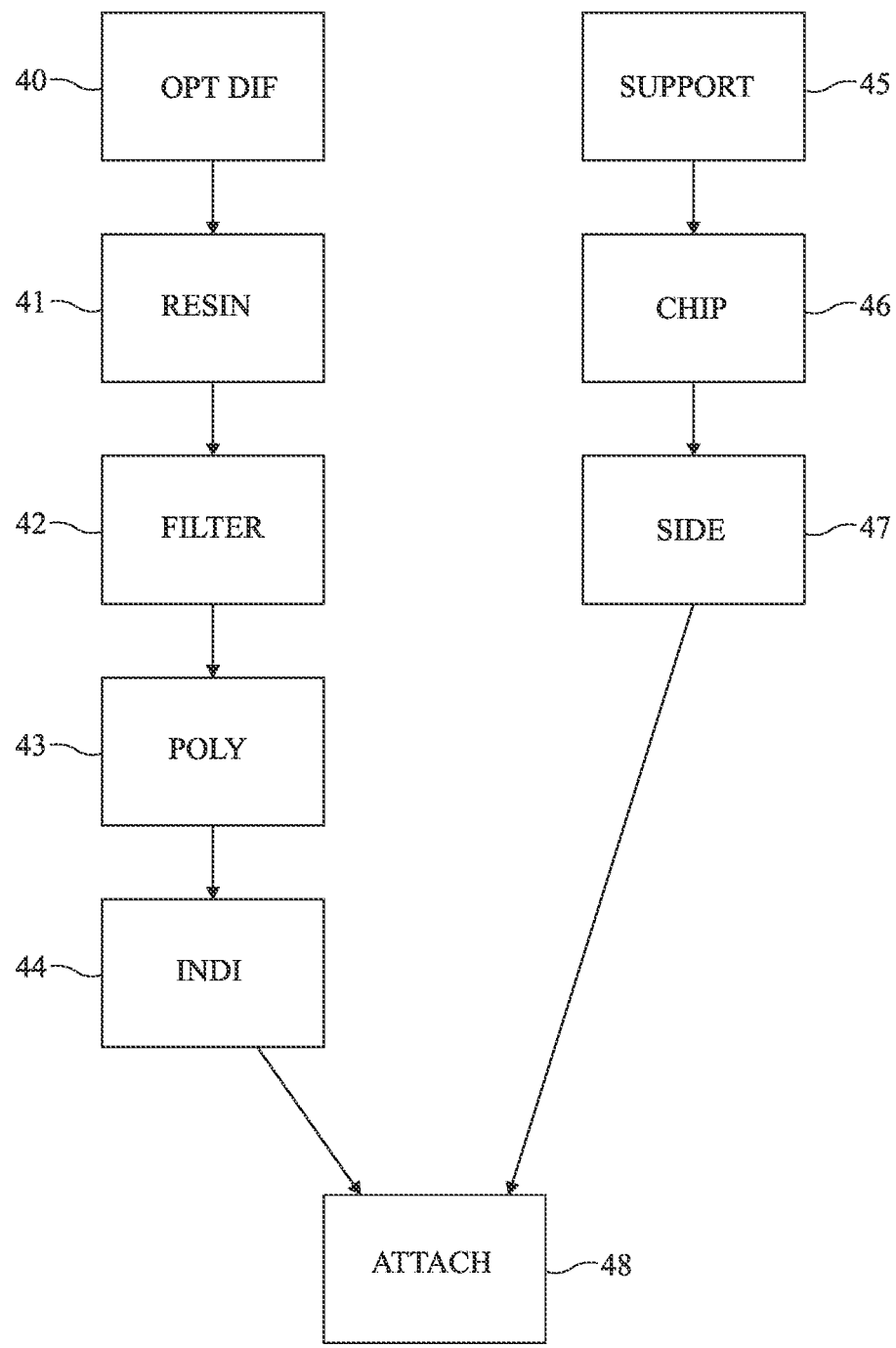
FIG. 2 shows a method of manufacturing the embodiment of FIG. 1.

FIG. 2 shows a method of manufacturing the embodiment of FIG. 1. More precisely, FIG. 2 illustrates a method of simultaneous manufacturing of a plurality of devices 10.

During a first step 40 (OPT DIF), optical blocks 26 are formed. This step preferably comprises the deposition and the treatment of layers having optical properties on a core, for example a glass core. Preferably, a plate comprising a plurality of optical blocks 26 is manufactured by depositing and treating the different layers over the entire wafer.

During a step 41 (RESIN), a layer made of the material of layer 30, for example a resin layer, is deposited on the plate, preferably over the entire plate. In other words, a surface of the plate is entirely covered with said layer made of the material of layer 30. This layer will form the layer 30 of the different devices 10.

Layer 30 preferably has a thickness in the range from 20 μm to 80 μm, preferably from 50 to 80 μm.

The material of layer 30 is, at this step, in a liquid or flexible state. The material is, for example, deposited on the plate by a syringe.

During a step 42 (FILTER), optical blocks 28 are placed on layer 30. More precisely, an optical block 28 is placed on each optical block 26. For example, optical blocks 28 originate from a plate comprising a plurality of optical blocks 28 which is, before step 43, divided into a plurality of optical blocks 28.

During a step 43 (POLY), the assembly comprising the plate of optical blocks 26, optical blocks 28, and layer 30 are submitted to a polymerization. Layer 30 then becomes solid. Each optical block 28 is then attached to optical block 26 by hardened layer 30.

Layer 30 may thus be a bonding layer for optical blocks 26 and 28, with which it was in contact during the polymerization. However, layer 30 may not be used as a bonding layer in the next steps.

During a step 44 (INDI), optical blocks 26 are individualized. In other words, the plate comprising optical blocks 26 and layer 30 are divided to form distinct optical blocks 26 covered with layers 30 and with optical blocks 28.

During a step 45 (SUPPORT), support 14 is formed. Preferably, a plate comprising a plurality of supports 14 is formed and divided to obtain supports 14.

The forming of supports 14, for example, comprises the forming of insulating layers and/or the forming of conductive tracks and of conductive vias. In particular, the forming of supports 14 comprises the forming of conductive tracks 16.

During a step 46 (CHIP), a chip 12, previously formed, is attached to each support 14. Connections, for example by electric cables 18, are formed between each chip and the support on which it is attached.

During a step 47 (SIDE), the lateral walls are formed. For example, the lateral walls are formed independently from the support, for example by using a plastic injection mold, and is then attached to the support. As a variant, the lateral walls of each device may be formed by placing a mold having the shape of walls 22 on each support 14, and by filling it with resin which is then solidified.

Steps 40 to 44 are preferably successive steps. Similarly, steps 45 to 47 are preferably successive steps. Steps 40 to 44 are preferably carried out independently from steps 45 to 47.

During a step 48 (ATTACH) subsequent to steps 47 and 44, glue layer 32 is placed on the portions of each layer 30 which are not covered with optical block 28. Each assembly comprising optical blocks 26 and 28 and layer 30 is then placed on the walls 22 of a support 14, so that glue 32 is in contact with the portion 22b of walls 22. The devices are then heated, to solidify the glue layer.

As a variant, the glue layer may be placed on portion 22b and not on layer 30.

As a variant, the steps of blocks 43 and 44, that is, the polymerization of layer 30 and the individualization of optical blocks 26, may be performed before the step of block 42, that is, the placing of optical blocks 28. In this case, the step of placing optical blocks 28 comprises the forming of a glue layer, preferably at least partially transparent, between each layer 30 and the corresponding optical block 28.

FIG. 3 shows another embodiment of an optoelectronic device 50.

Device 50 comprises elements identical to elements of the embodiment of FIG. 1. These elements will be designated with the same references and will not be detailed again. In particular, device 50 comprises chip 12, support 14, lateral walls 22, optical block 26, and optical block 28.

Device 50 differs from device 10 in that layer 30 is replaced with a region 52. Region 52 is made of the same material as the layer 30 of FIG. 1. Region 52 enables, like layer 30, to attach to each other optical blocks 26 and 28. Region 52 is entirely located between optical blocks 26 and 28. Region 52 is entirely located between optical blocks 26 and 28. Region 52 is thus entirely opposite optical blocks 26 and 28. However, in the embodiment of FIG. 3, region 52 does not entirely cover the upper surface of optical block 28. Thus, certain portions of optical blocks 26 and 28 are not separated from each other by region 52.

In the example of FIG. 3, region 52 forms a continuous ring extending over a peripheral portion of the upper surface of optical block 28. Region 52 preferably surrounds the region through which most of the light rays, preferably substantially all the light rays, cross optical block 28. Thus, region 52 extends around the region opposite the portion of chip 12 receiving or emitting the light rays.

A cavity 54 is thus formed inside of the ring formed by region 52 and by the upper surface of optical block 28 and the lower surface of optical block 26. Cavity 54 is preferably opposite the portion of chip 12 receiving or emitting the light rays. Cavity 54 is preferably filled with air. The cavity comprises no glue.

As in device 10, the optical blocks 26 and 28 of device 50 are attached to the portion 22b of lateral walls 22 by a glue layer 56. Glue layer 56 differs from the glue layer 32 of FIG. 1 in that layer 56 is in contact with optical block 26.

Layer 56 separates, and attaches to one another, portions 22b and the peripheral portions of optical block 26. Layer 56 is in contact with portions 22b and the peripheral portions of optical block 26, that is, the portions around the portion opposite cavity 54 and region 52. Further, like layer 30, layer 56 separates, and attaches to each other, the lateral walls of the block and portions 22b.

An advantage of the ring shape of region 52 is that it assures that the glue of layer 56 does not come into contact with the portion of optical block 26 crossed by the light rays emitted or received by chip 12.

The method of manufacturing the embodiment of FIG. 3 differs from the method described in relation with FIG. 2 in that step 41 is replaced with a step of forming of region 52. More precisely, during the step replacing step 41, region 52 is formed, for example with a syringe or by means of a stencil and a screening blade, on each optical block 26.

In the embodiment of FIG. 3, layer 30 preferably has a thickness in the range from 20 μm to 80 μm, preferably from 20 μm to 30 μm.

As a variant, the method of manufacturing the embodiment of FIG. 3 may also differ from the method described in relation with FIG. 2 in that optical blocks 26 may be individualized before the forming of regions 52. Thus, step 42 may be carried out before the step replacing step 41.

FIG. 4 shows another embodiment of an optoelectronic device 60.

Device 60 comprises elements identical to elements of the embodiments of FIGS. 1 and 3. These elements will be designated with the same reference numerals and will not be detailed again. In particular, device 60 comprises chip 12, support 14, lateral walls 22, optical block 26, and optical block 28. Device 60 further comprises the layer 30 of FIG. 1.

Device 60 differs from device 10 in that optical block 28 is not located in opening 24. Further, the horizontal dimensions of optical block 28 are, in this embodiment, greater than the dimensions of opening 24. Thus, optical block 28 covers opening 24. A peripheral portion of the lower surface of optical block 28 rests on portions 22b and the central portion is opposite opening 24.

As in FIG. 1, layer 30 entirely covers the lower surface of optical block 26. As in FIG. 1, optical block 28 is attached to a central or inner portion of the lower surface of layer 30. Device 60 differs from the device 10 of FIG. 1 in that the peripheral portion of the lower surface of layer 30, that is, the portion which is not in contact with optical block 28, is not in contact with the portion 22b of lateral wall 22.

Optical block 28 is surrounded with a block 62. Block 62 is in contact with layer 30. Block 62 is attached to optical block 26 by layer 30. Block 62 preferably extends, in the vertical direction, from layer 30 to the level of the lower surface of optical block 28. The thickness of block 62 is thus preferably substantially equal to the thickness of optical block 28. Block 62 preferably extends in the horizontal directions from the lateral walls of optical block 28 to the level of the lateral walls of optical block 26. Optical blocks 26, 28, and 62, as well as layer 30 thus form an assembly preferably substantially having the shape of a cuboid.

Block 62 rests on portion 22b. Block 62 is attached to wall 22 by a glue layer 64. The glue layer is located between the lateral walls of block 62 and wall 22, preferably in a cavity formed by portions 22a and 22b and block 62.

Block 62 is, for example, made of an at least partially transparent material, for example made of glass. Glue layer 64 then preferably extends, in the vertical direction, from portion 22b to a level lower than the upper surface of portion 22a, preferably a level higher than the lower surface of layer 30, preferably a level higher than the upper surface of layer 30. Thus, all the light rays entering or coming out of the package cross optical blocks 26 and 28.

As a variant, block 62 is, for example, made of an opaque material. Glue layer 64 then extends, for example in the vertical direction, from portion 22b to a level lower than the upper surface of portion 22a, preferably lower than the lower surface of optical block 26, for example lower than the lower surface of layer 30.

The method of manufacturing the embodiment of FIG. 4 differs from the manufacturing method described in relation with FIG. 2 in that step 43 of deposition of optical blocks 28 on layer 30 further comprises the deposition of a region 62 around each optical block 26. Further, step 48 differs in that the assembly comprising optical blocks 26 and 28, layer 30, and region 62 is laid on portions 22b before the glue is placed between the assembly and portion 22a.

As a variant, optical block 28 may cover the entire layer 30. In other words, region 62 is replaced with optical block 28. In other words, the device comprises a stack of optical block 28, of layer 30, and of optical block 26, having substantially identical horizontal dimensions. Thus, layer 30 is entirely between optical block 26 and optical block 28.

It could have been chosen to attach, for example with a glue layer, optical block 28 to the lower surface of portions 22b and to attach, for example by a glue layer, optical block 26 to the upper surface of portions 22b. The upper surface of optical block 28 and the lower surface of optical block 26 would thus have been separated by the thickness of two glue layers and the thickness of portions 22b, which is thicker than the thickness of a resin layer. In particular, the thickness of portion 22b is necessarily, to support optical blocks 26 and 28, greater than the thickness of layer 30.

An advantage of the described embodiments is that they enable to form a more compact package.

Another advantage of the described embodiments is that optical block 26, and in particular the portion opposite chip 12, is not degraded by the glue.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

The invention claimed is:

1. A device, comprising:
   a substrate;

an optoelectronic element mounted to the substrate; and
a package mounted to the substrate over the optoelectronic element, the package comprising:
lateral walls including a vertical portion and a horizontal portion extending from the vertical portion to delimit an opening arranged over the optoelectronic element;
a first optical block having a lower surface;
a second optical block having an upper surface;
a resin bonding material between the lower surface and the upper surface to attach the first and second optical blocks to each other and form an optical assembly; and
a glue material configured to secure the optical assembly to at least the horizontal portion of the lateral walls and close said opening;
wherein a stress induced by the resin bonding material on the optical assembly is less than a stress induced by the glue material on the optical assembly.

2. The device according to claim 1, wherein the resin bonding material has a linear expansion coefficient in a range from 150 ppm/K to 200 ppm/K.

3. The device according to claim 1, wherein the first optical block is an optical diffuser.

4. The device according to claim 1, wherein the first optical block is a planar chip configured to carry out one or more of the following optical functions: diffusion, polarization, or focusing.

5. The device according to claim 1, wherein the second optical block comprises at least one filter.

6. The device according to claim 1, wherein the second optical block is positioned within the opening and a peripheral area of the bottom surface of the first optical block is supported by an upper surface of the horizontal portion of the lateral walls which surrounds the opening.

7. The device according to claim 6, wherein the resin bonding material is positioned on said peripheral area of the bottom surface of the first optical block, and wherein the glue material attaches the resin bonding material to the upper surface of the horizontal portion of the lateral walls which surrounds the opening.

8. The device according to claim 6, wherein the resin bonding material is not positioned on said peripheral area of the bottom surface of the first optical block, and wherein the glue material attaches the peripheral of the bottom surface of the first optical block to the upper surface of the horizontal portion of the lateral walls which surrounds the opening.

9. The device according to claim 8, wherein the resin bonding material is formed in a ring shape surrounding a central portion of the bottom surface of the first optical block and a central portion of the upper surface of the second optical block, said ring shape of the resin bonding material delimiting a cavity between the first and second optical blocks in the optical assembly.

10. The device according to claim 1, wherein the second optical block is positioned to extend over the opening and a peripheral area of a bottom surface of the second optical block is supported by an upper surface of the horizontal portion of the lateral walls which surrounds the opening.

11. The device according to claim 10, further comprising a support block surrounding the second optical block, and wherein a bottom surface of the support block is supported by the upper surface of the horizontal portion of the lateral walls.

12. The device according to claim 11, wherein the glue material is configured to secure the support block of the optical assembly to at least the horizontal portion of the lateral walls.

13. The device according to claim 1, wherein a distance between a bottom surface of the horizontal portion of said lateral walls and an upper surface of the substrate is greater than a thickness of the optoelectronic element mounted to the upper surface of the substrate.

14. A device, comprising:
a substrate;
an optoelectronic element mounted to the substrate; and
a package mounted to the substrate over the optoelectronic element, the package comprising:
lateral walls including a vertical portion and a horizontal portion extending from the vertical portion to delimit an opening arranged over the optoelectronic element;
a first optical block having a lower surface;
a second optical block having an upper surface;
a ring made of resin bonding material positioned between the lower surface and the upper surface to attach the first and second optical blocks to each other and delimit a cavity between the lower surface and the upper surface; and
a glue material configured to secure the lower surface of the first optical block and a side surface of the second optical block to at least the horizontal portion of the lateral walls and close said opening.

15. The device according to claim 14, wherein the first optical block is an optical diffuser.

16. The device according to claim 14, wherein the first optical block is a planar chip configured to carry out one or more of the following optical functions: diffusion, polarization, or focusing.

17. The device according to claim 14, wherein the second optical block comprises at least one filter.

18. The device according to claim 14, wherein the second optical block is positioned within the opening and a peripheral area of the bottom surface of the first optical block is supported by an upper surface of the horizontal portion of the lateral walls which surrounds the opening.

19. A device, comprising:
a substrate;
an optoelectronic element mounted to the substrate; and
a package mounted to the substrate over the optoelectronic element, the package comprising:
lateral walls including a vertical portion and a horizontal portion extending from the vertical portion to delimit an opening arranged over the optoelectronic element;
a first optical block having a lower surface;
a second optical block;
a support block surrounding the second optical block, wherein the support block and second optical block have a coplanar upper surface and a coplanar lower surface;
a resin bonding material positioned between the lower surface and the coplanar upper surface to attach the first optical block to the second optical block and support block;
wherein the coplanar lower surface rests on an upper surface of the horizontal portion of the lateral walls to close said opening; and
a glue material configured to secure the support block to at least the horizontal portion of the lateral walls.

20. The device according to claim 19, wherein the first optical block is an optical diffuser.

21. The device according to claim 19, wherein the first optical block is a planar chip configured to carry out one or more of the following optical functions: diffusion, polarization, or focusing.

22. The device according to claim 19, wherein the second optical block comprises at least one filter.

\* \* \* \* \*